(12) United States Patent
Iinuma

(10) Patent No.: US 7,768,094 B2
(45) Date of Patent: Aug. 3, 2010

(54) SEMICONDUCTOR INTEGRATED CIRCUIT AND WAFER HAVING DIFFUSION REGIONS DIFFERING IN THICKNESS AND METHOD FOR MANUFACTURING THE SAME

(75) Inventor: Toshihiko Iinuma, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 826 days.

(21) Appl. No.: 11/220,716

(22) Filed: Sep. 8, 2005

(65) Prior Publication Data
US 2006/0226447 A1    Oct. 12, 2006

(30) Foreign Application Priority Data
Apr. 7, 2005   (JP) .................... P2005-111195

(51) Int. Cl.
*H01L 23/58* (2006.01)
(52) U.S. Cl. ................ 257/500; 257/E21.433; 257/E21.435
(58) Field of Classification Search ........... 455/296; 323/274, 474; 257/382, 301–310, 500, E21.433, 257/E21.435
See application file for complete search history.

(56) References Cited

U.S. PATENT DOCUMENTS

| | | | | | |
|---|---|---|---|---|---|
| 3,980,993 | A | * | 9/1976 | Bredart et al. | 713/501 |
| 4,814,854 | A | * | 3/1989 | Tigelaar et al. | 257/382 |
| 5,471,663 | A | * | 11/1995 | Davis | 455/296 |
| 6,236,194 | B1 | * | 5/2001 | Manabe et al. | 323/274 |
| 6,657,249 | B2 | * | 12/2003 | Nishioka et al. | 257/315 |
| 2001/0025997 | A1 | * | 10/2001 | Onishi | 257/402 |
| 2003/0193066 | A1 | | 10/2003 | Ito et al. | |

FOREIGN PATENT DOCUMENTS

JP          09-050961          2/1997

* cited by examiner

*Primary Examiner*—Davienne Monbleau
*Assistant Examiner*—Monica D Harrison
(74) *Attorney, Agent, or Firm*—Finnegan, Henderson, Farabow, Garrett & Dunner, L.L.P.

(57) ABSTRACT

A semiconductor integrated circuit includes a rectangular low speed circuit area including a low speed circuit comprising a low speed transistor having a first source extension region and a first drain extension region, and a rectangular high speed circuit area adjacent to the low speed circuit area and including a high speed circuit comprising a high speed transistor having a second source extension region and a second drain extension region thinner than the first source and drain extension regions.

10 Claims, 8 Drawing Sheets

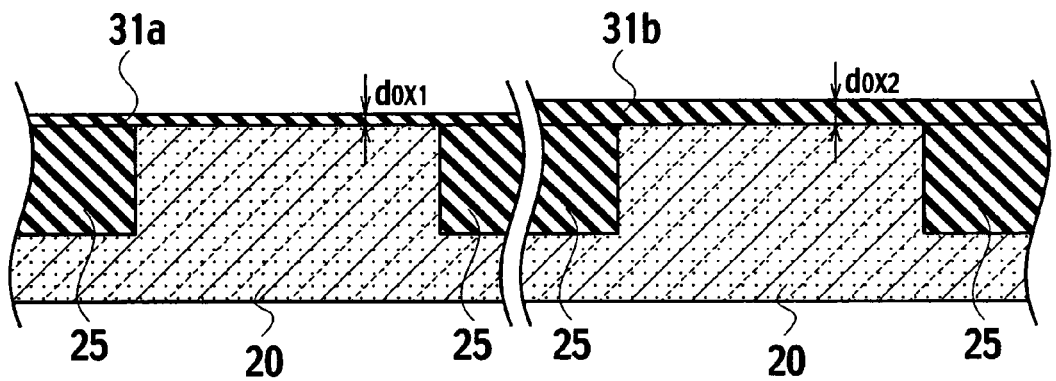
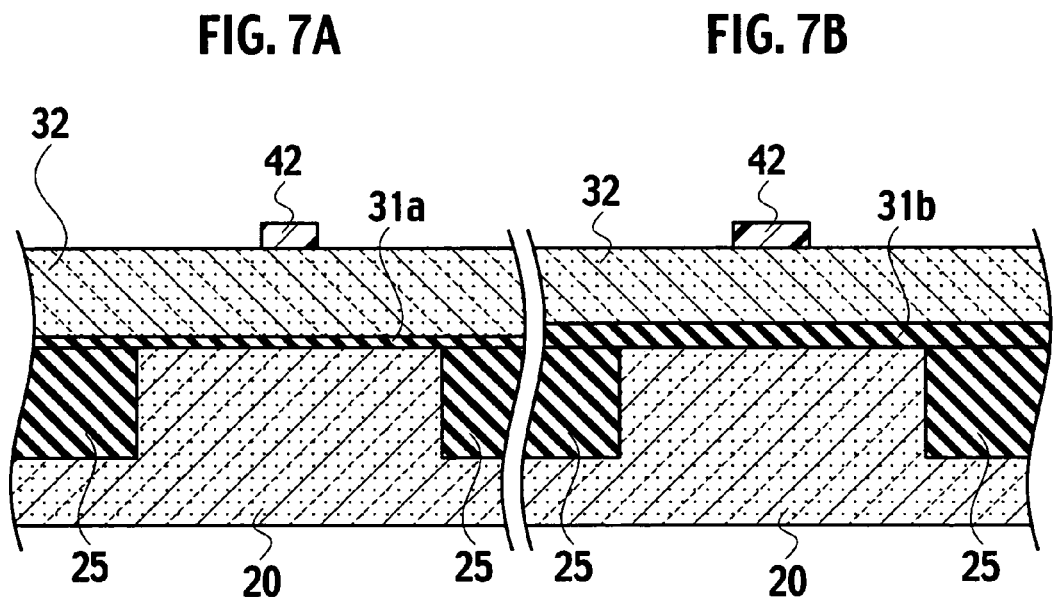

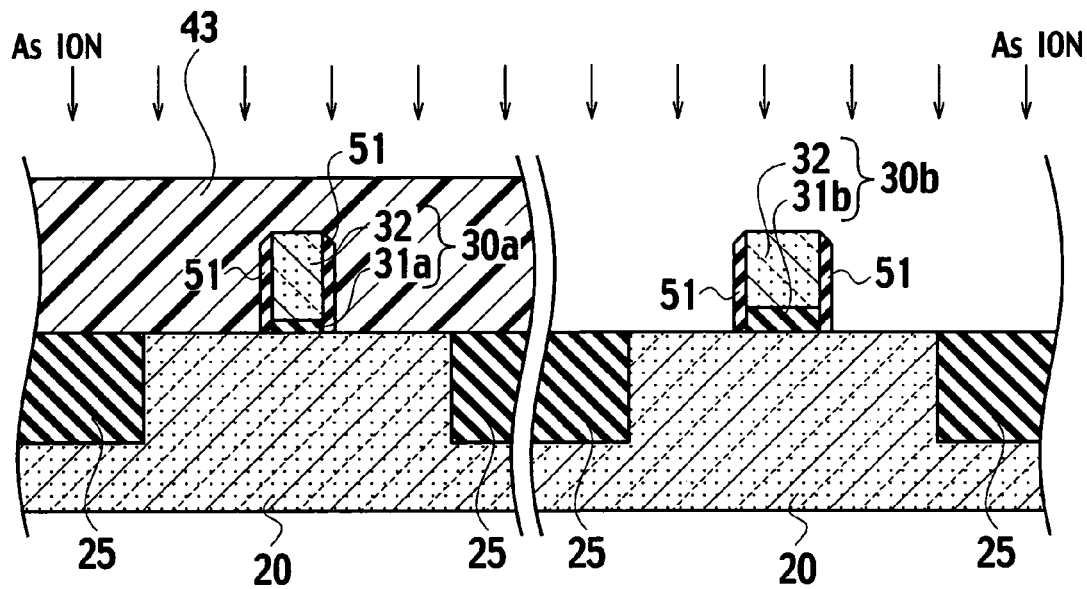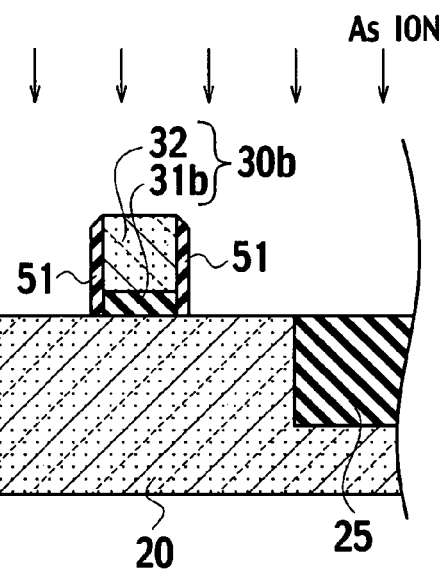
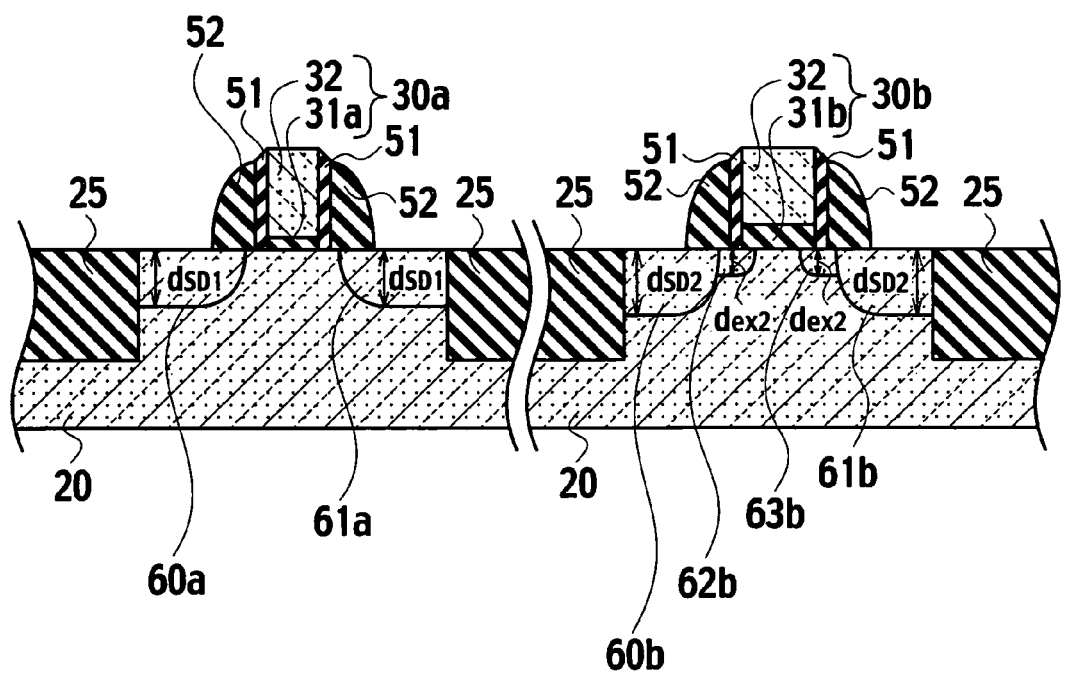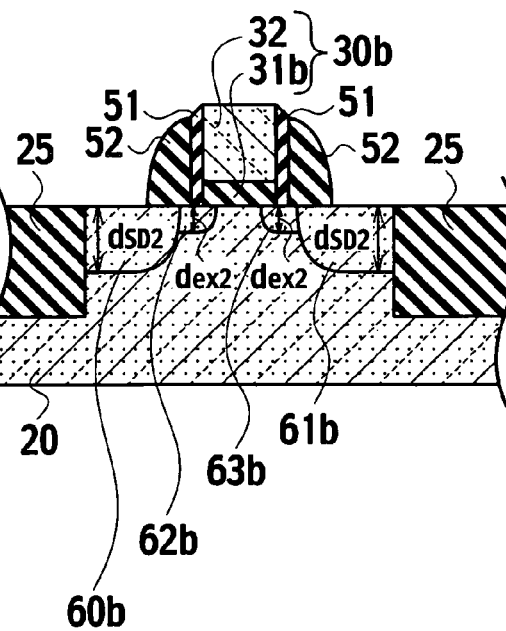

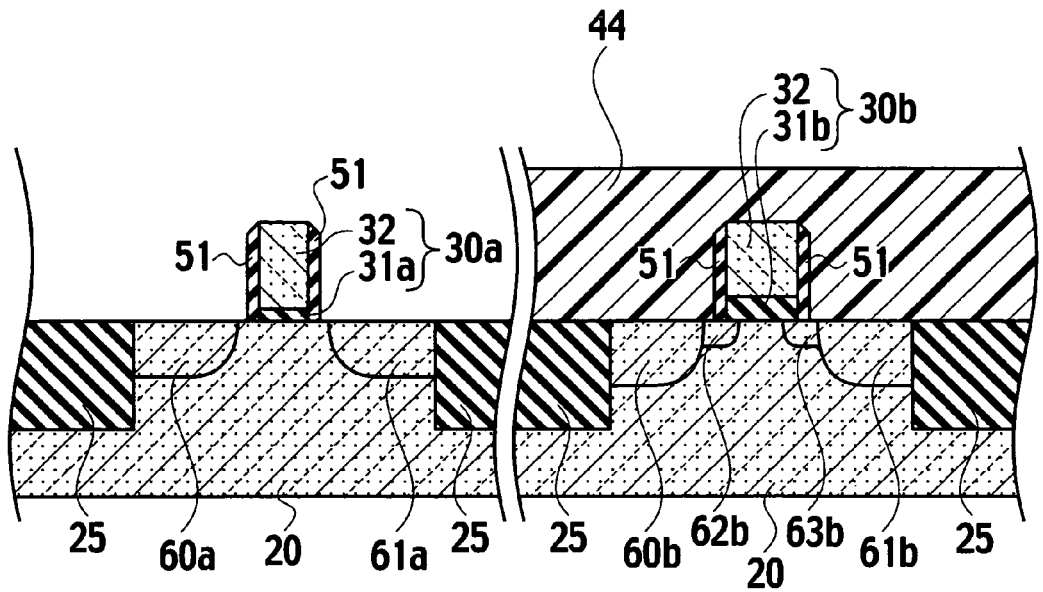
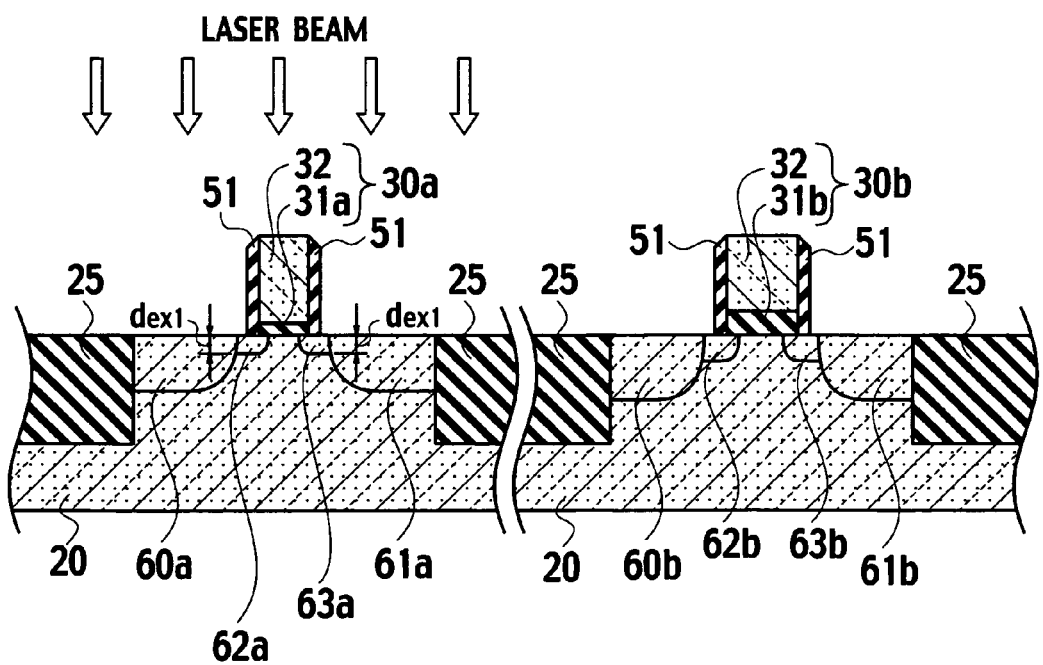

SEMICONDUCTOR INTEGRATED CIRCUIT AND WAFER HAVING DIFFUSION REGIONS DIFFERING IN THICKNESS AND METHOD FOR MANUFACTURING THE SAME

CROSS REFERENCE TO RELATED APPLICATIONS AND INCORPORATION BY REFERENCE

This application is based upon and claims the benefit of priority from prior Japanese Patent Application P2005-111195 filed on Apr. 7, 2005; the entire contents of which are incorporated by reference herein.

BACKGROUND OF THE INVENTION

1. Field of the Invention

The present invention relates to a semiconductor integrated circuit, and particularly relates to a semiconductor integrated circuit having a plurality of different types of circuits, differing in function, integrated on the same chip, and a fabrication method for the same.

2. Description of the Related Art

Semiconductor integrated circuits (LSIs) are capable of including circuits with various functions integrated on a single chip. For example, a high-speed operating logic circuit and large capacity memory, such as a dynamic random access memory (DRAM) are integrated on the same chip.

The demand for miniaturized and speed-enhanced LSIs is increasing. The demands for an LSI with a half pitch of 65 nm or less are given in the INTERNATIONAL TECHNOLOGY ROADMAP FOR SEMICONDUCTORS 2003 EDITION, for example. The thickness of diffusion regions, such as a source region, a drain region, a source extension region, and a drain extension region, is thin, approximately 13.8 nm so as to suppress a short-channel effect. Furthermore, sheet resistances of the diffusion regions, such as the source region, the drain region, the source extension region, and the drain extension region, should be 412 ohms or less in the case of an n-channel MOS transistor, and 884 ohms or less in the case of a p-channel MOS transistor have been in demand in order to prevent reduction of transistor characteristics due to parasitic resistance. The 'source extension region' and the 'drain extension region' are formed near gate electrodes of the source region and the drain region, respectively. Generally, the source extension region and the drain extension region have a higher impurity concentration and are thinner than the source region and the drain region, respectively. It is difficult to fabricate an LSI that satisfies the above requirements by, use of a diffusion furnace type heat treatment apparatus or a lamp annealing apparatus that uses a tungsten halogen lamp as a light source.

Therefore, there is a demand for a heat treatment apparatus that carries out high temperature heat treatment in a short period of time by using a lamp annealing apparatus. A response to that demand is a line scanning heat treatment apparatus using an infrared laser beam as a heat source. Heat treatment using a line scanning heat treatment apparatus is hereafter called 'high temperature laser heat treatment'. The diffusion regions are made thinner through high temperature laser heat treatment.

The line scanning heat treatment apparatus fails to carry out heat treatment over the entire wafer at one time since it is difficult to increase the laser beam irradiating area. Accordingly, with the line scanning heat treatment apparatus, heat treatment is carried out by scanning a laser beam that irradiates a small area. However, high temperature laser heat treatment has the following demerits. Namely, with high temperature laser heat treatment, restoration of crystal defects formed by ion implantation is inadequate. In addition, crystal defects other than ion implantation defects may be generated by high temperature laser heat treatment. Furthermore, there are cases where insulation characteristics of gate insulating films deteriorate.

Higher switching speed transistors have been in demand for high-speed logic circuits. Accordingly, activation of impurities through high temperature laser heat treatment is necessary for logic circuits. On the other hand, with a DRAM or the like that retains data by accumulating charges, increasing density of the transistors and suppressing leakage current of the transistors, so as to retain memory data for a long period of time, are more important than increasing the transistor switching speed. Accordingly, application of high temperature laser heat treatment to DRAM fabrication is unnecessary. On the other hand, since crystal defects are generated due to application of high temperature laser heat treatment, required DRAM performance may deteriorate. Therefore, it is difficult to apply high temperature laser heat treatment to logic circuits integrated on the same chip in which a memory, such as DRAM, is fabricated.

SUMMARY OF THE INVENTION

An aspect of the present invention inheres in a semiconductor integrated circuit including a low speed circuit area including a rectangular low speed circuit comprising a low speed transistor having a first source extension region and a first drain extension region; and a rectangular high speed circuit area adjacent to the low speed circuit area and including a high speed circuit comprising a high speed transistor having a second source extension region and a second drain extension region thinner than the first source and drain extension regions.

Another aspect of the present invention inheres in a wafer including a plurality of low speed chip areas in which a plurality of low speed circuit areas are arranged in a column direction, each including a low speed circuit comprising a low speed transistor having a first source extension region and a first drain extension region; and a plurality of high speed chip areas in which a plurality of high speed circuit areas are arranged in a column direction, each having a high speed circuit comprising a high speed transistor having a second source extension region and a second drain extension region thinner than the first second and drain diffusion regions; wherein the low speed chip areas and the high speed chip areas are alternately arranged in a row direction.

Still another aspect of the present invention inheres in a method of manufacturing a semiconductor integrated circuit. The method includes forming a first source extension region and a first drain extension region of a low speed transistor of a low speed circuit arranged in a low speed circuit area with a first heat treatment condition; and forming second source and drain extension regions that are thinner than the first source and drain extension regions under a second heat treatment condition at a higher temperature for a shorter duration than the first heat treatment condition, by irradiating a laser beam to activate ions implanted in the second source and drain extension regions of a high speed transistor of a high speed circuit arranged in a high speed circuit area adjacent to the low speed circuit area.

BRIEF DESCRIPTION OF DRAWINGS

FIGS. 4A through 13A and FIGS. 4B through 13B are cross-sectional views describing a fabrication process based on a fabrication method for transistors constituting the semiconductor integrated circuit according to the embodiment of the present invention.

DETAILED DESCRIPTION OF THE INVENTION

Figure 1:
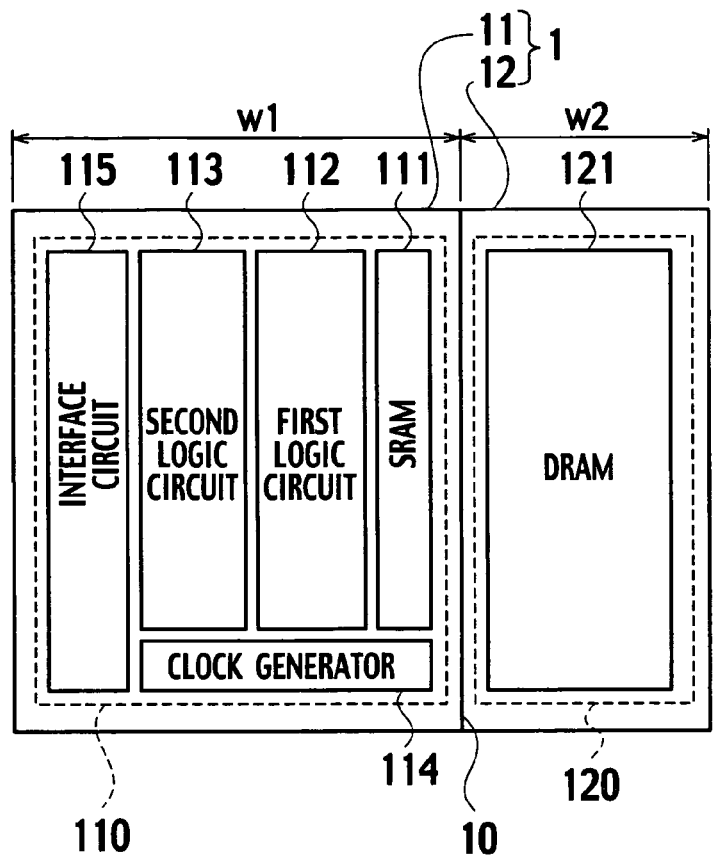
FIG. 1 is a schematic view showing a structure of a semiconductor integrated circuit according to an embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. Generally and as it is conventional in the representation of semiconductor devices, it will be appreciated that the various drawings are not drawn to scale from one figure to another nor inside a given figure.

In the following descriptions, numerous specific details are set forth such as specific signal values, etc. to provide a thorough understanding of the present invention. However, it will be obvious to those skilled in the art that the present invention may be practiced without such specific details. In other instances, well-known circuits have been shown in block diagram form in order not to obscure the present invention in unnecessary detail.

A semiconductor integrated circuit according to the embodiment of the present invention includes a rectangular low speed circuit area 12 and a rectangular high speed circuit area 11, as shown in FIG. 1. The low speed circuit area 12 includes a low speed circuit 120 comprising low speed transistors, each having a first source extension region and a first drain extension region. The high speed circuit area 11 is adjacent to the low speed circuit area 12, and includes a high speed circuit 110 comprising high speed transistors, each having a second source extension region and a second drain extension region. The second source and drain extension regions have a greater thickness than the first source and drain extension regions in a direction perpendicular to a substrate surface. As described later, differing heat treatment conditions are applied to the high speed circuit area 11 and the low speed circuit area 12 when the first source and drain extension regions and the second source and drain extension regions are formed.

As shown in FIG. 1, the high speed circuit area 11 and the low speed circuit area 12 are arranged in parallel. The boundary between the high speed circuit area 11 and the low speed circuit area 12 is hereafter referred to as 'circuit boundary'. Since the high speed circuit area 11 and the low speed circuit area 12 are rectangular, the circuit boundary 10 is a straight line. Here, the length of the sides of the high speed circuit area 11 and the low speed circuit area 12 that is orthogonal to the circuit boundary 10 is referred to as 'width'. As shown in FIG. 1, the width of the high speed circuit area 11 is W1, and the width of the low speed circuit area 12 is W2.

An exemplary semiconductor integrated circuit having a plurality of integrated circuits arranged on a chip 1 is described forthwith. First, a semiconductor integrated circuit is includes circuits emphasizing integration density and memory data retention, and circuits emphasizing transistor switching speed. In addition, a high speed circuit 110, for which a fast transistor switching speed is paramount, is arranged in the high speed circuit area 11. On the other hand, the low speed circuit 120, for which integration density and memory data retention are paramount, is arranged in the low speed circuit area 12. The high speed circuit area 11 is subjected to a high temperature laser heat treatment by a line scanning heat treatment apparatus or the like. The line scanning heat treatment apparatus is capable of heating a portion of the surface of a wafer that has been irradiated by a laser to 1000 degrees Celsius or more in 1/1000 second or less, for example. Therefore, a diffusion region having a reduced thickness in a direction perpendicular to the substrate surface may be formed. As a result, the switching speed of the high speed transistors comprising the high speed circuit 110 may be increased by high temperature laser heat treatment. There is a possibility that high temperature laser heat treatment increases crystal defects and leakage current, and deteriorates memory data retention characteristics. Therefore, the low speed circuit area 12 is not subjected to the high temperature laser heat treatment.

For example, as shown in FIG. 1, static RAM (SRAM) 111, a first logic circuit 112 which is required to operate at a high speed, a second logic circuit 113 which is not required to operate at as high a speed as the first logic circuit 112, a clock generator 114 that generates clock signals, and an interface circuit 115 that controls input and output signals to the chip 1 are arranged as the high speed circuit 110 in the high speed circuit area 11. On the other hand, DRAM 121 emphasizes integration density and memory data retention rather than transistor switching speed and is arranged as the low speed circuit 120 in the low speed circuit area 12.

Figure 2:
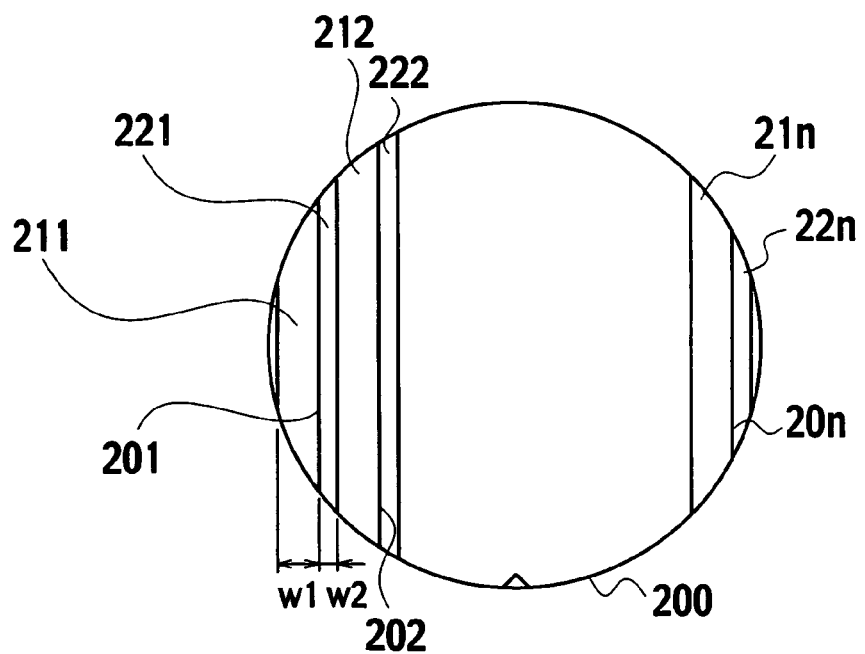
FIG. 2 is a schematic view showing an exemplary arrangement of the semiconductor integrated circuit according to the embodiment of the present invention, on a wafer.
Figure 3:
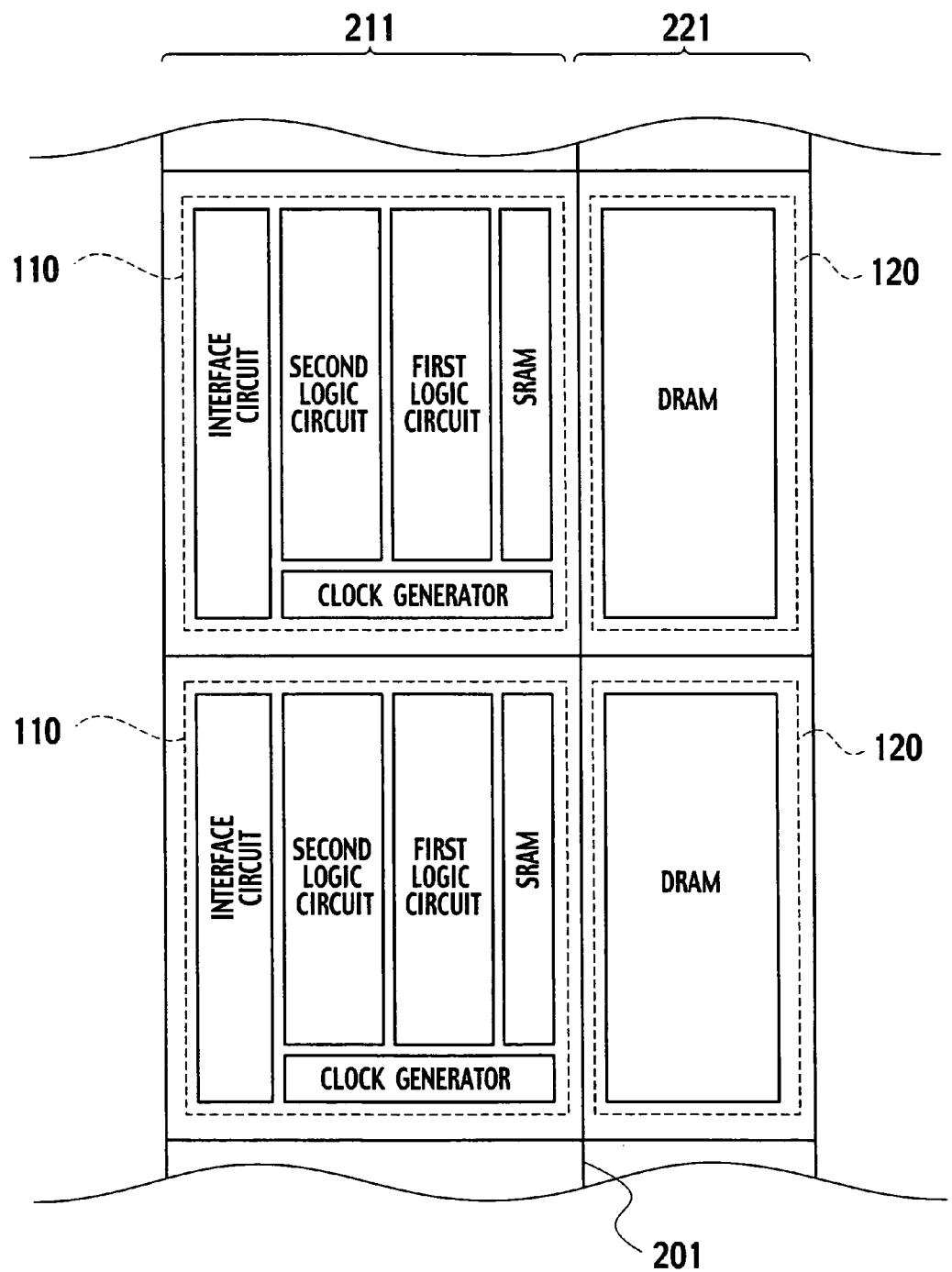
FIG. 3 is an enlarged view for describing a layout on the wafer shown in FIG. 2.

An exemplary arrangement of the chip 1 of FIG. 1 on a wafer 200 is shown in FIG. 2. As shown in FIG. 2, a plurality of high speed chip areas 211 through 21n and a plurality of low speed chip areas 221 through 22n are alternately arranged in a row direction (n is an integer of 2 or greater). As shown in FIG. 3, the high speed chip areas 211 through 21n have a plurality of high speed circuit areas 11 arranged adjacent to each other in a column direction. Similarly, the low speed chip areas 221 through 22n have a plurality of low speed circuit areas 12 arranged adjacent to each other in the column direction Here, boundaries between the high speed chip areas 211 through 21n and the low speed chip areas 221 through 22n are hereafter referred to as 'chip boundaries'. Chip boundaries 201 through 20n are made up of linearly consecutive multiple circuit boundaries 10.

The length of each of the sides of the high speed chip areas 211 through 21n orthogonal to the chip boundaries 201 through 20n is fixed to width W1. Furthermore, the length of each of the sides of the low speed chip areas 221 through 22n orthogonal to the chip boundaries 201 through 20n is fixed to width W2. Width of areas irradiated by a laser beam emitted from the line scanning heat treatment apparatus is adjusted in accordance with width W1 of the high speed chip areas 211 through 21n. Therefore, it is possible to successively irradiating only the high speed chip areas 211 through 21n with a laser beam from the line scanning heat treatment apparatus. Then, the second source and drain extension regions of the high speed transistors comprising the high speed circuits 110 may be formed by a short time heat treatment. Therefore, thickness of the second source and drain extension regions of the high speed transistor is reduces. As a result, the switching speed of the high speed circuits 110 arranged in the high speed circuit areas 11 is increased.

In comparison, the first source and drain extension regions of the low speed transistors comprising the low speed circuits 120 arranged in the low speed chip areas 221 through 22n are formed by a heat treatment lower in temperature than the high temperature laser heat treatment using the line scanning heat treatment apparatus, such as a diffusion furnace type heat treatment apparatus or a lamp annealing apparatus that utilizes a tungsten halogen lamp, for example, as a light source. Therefore, the DRAM 121 arranged in the low speed circuit area 12 has fewer crystal defects than when subjected to high temperature laser heat treatment. As a result, leakage current of the DRAM 121 is reduced, enabling retention of memory data for a longer period.

According to the semiconductor integrated circuit of the embodiment of the present invention, circuit areas 11 are arranged in parallel. The circuits to be subjected to high temperature laser heat treatment are arranged in the circuit areas 11. The rectangular low temperature circuit areas 12 are also arranged in parallel so that low speed circuits therein are not subjected to high temperature laser heat treatment. This arrangement allows integration of a plurality of circuits subjected to different heat treatment conditions on the same chip. In other words, according to the semiconductor integrated circuit shown in FIG. 1, a semiconductor integrated circuit is provided with circuits that differ in required circuit operating speed and leakage current value and are integrated on the chip 1.

An exemplary fabrication method for the low speed transistor having a first source extension region and a first drain extension region, and the high speed transistor having a second source extension region and a second drain extension region, which have a reduced thickness in a direction perpendicular to a substrate surface, compared to the thickness of the first source and drain extension regions, is described forthwith. Note that the fabrication methods for the first source and drain extension regions and the second source and drain extension regions given forthwith is merely an example, and the present invention may naturally be implemented using other various fabrication methods including modification of this example. FIGS. 4A through 13A are cross-sectional views describing a fabrication process for a high speed transistor Qa formed in the high speed circuit area 11, and FIGS. 4B through 13B are cross-sectional views describing a fabrication process for a low speed transistor Qb formed in the low speed circuit area 12.

Figure 4A:
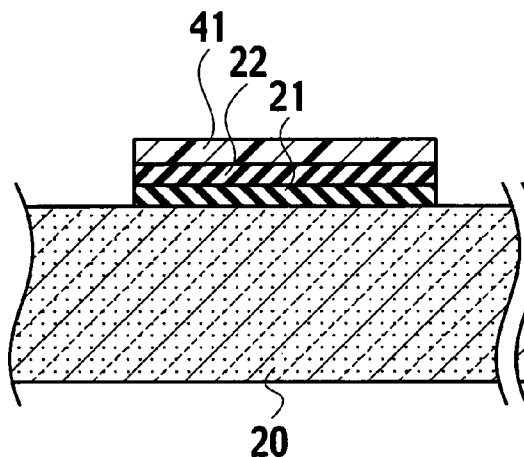
Figure 4B:
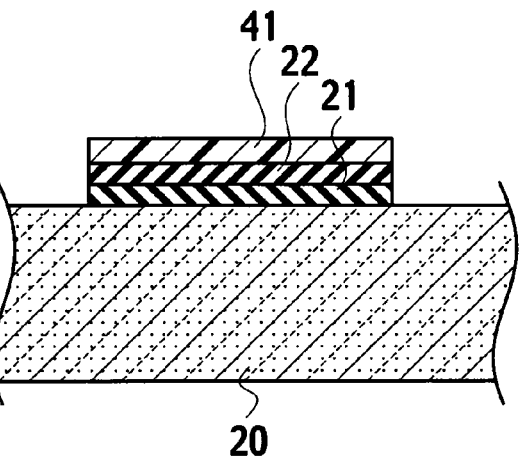
Figure 5A:
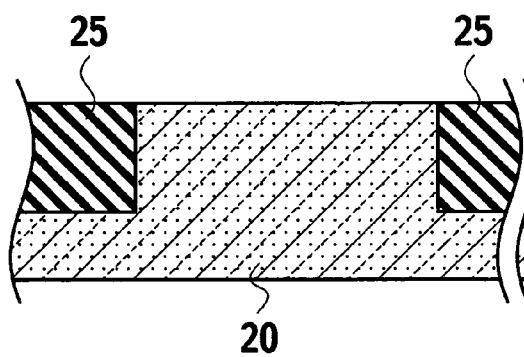
Figure 5B:
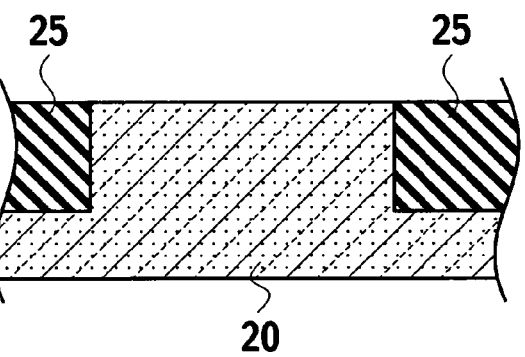

A silicon oxide film 21 and a silicon nitride film 22 are successively stacked upon a p-type silicon semiconductor substrate 20. A photoresist 41 is then applied on the silicon nitride film 22. The photoresist 41 is exposed and developed by photolithography, and as shown in FIGS. 4A and 4B, the photoresist 41 is removed in regions for forming device isolating grooves. Next, the silicon nitride film 22, the silicon oxide film 21, and the semiconductor substrate 20 are etched using the photoresist 41 as an etching mask to form device isolating grooves. Once the photoresist 41 is removed, device isolation insulating films 25, such as silicon oxide films, are formed to fill in the device isolating grooves. Furthermore, as shown in FIGS. 5A and 5B, planarization is carried out by chemical and mechanical polishing (CMP). Through this process, so-called 'active regions' surrounded by the device isolation insolating films 25 are defined in the semiconductor substrate 20.

In a state where the resist film is applied to only the low speed circuit area 12, a gate insulating film 31a of the high speed transistor Qa is formed by thermal oxidation or the like, as shown in FIG. 6A. Thickness $d_{ox1}$ of the gate insulating film 31a is approximately 1 to 2 nm. In comparison, in a state where the resist film is applied to only the high speed circuit area 11, a gate insulating film 31b of the low speed transistor Qb is formed by thermal oxidation or the like, as shown in FIG. 6B. Thickness $d_{ox2}$ of the gate insulating film 31b is approximately 6 nm. The gate insulating film 31a of the high speed transistor Qa is formed thin so as to increase the switching speed. In comparison, the gate insulating film 31b of the low speed transistor Qb is formed thick so as to reduce leakage current of the gate insulating film. Therefore, $d_{ox1} < d_{ox2}$.

Next, a gate electrode layer 32 such as a polysilicon film is formed across the entirety of the semiconductor substrate 20 by chemical vapor deposition (CVD) or the like. A photoresist 42 is then applied on the gate electrode layer 32. As shown in FIGS. 7A and 7B, the photoresist 42 is exposed and developed, and then removed in regions other than those for forming gate electrodes.

Figures 8A, 8B:
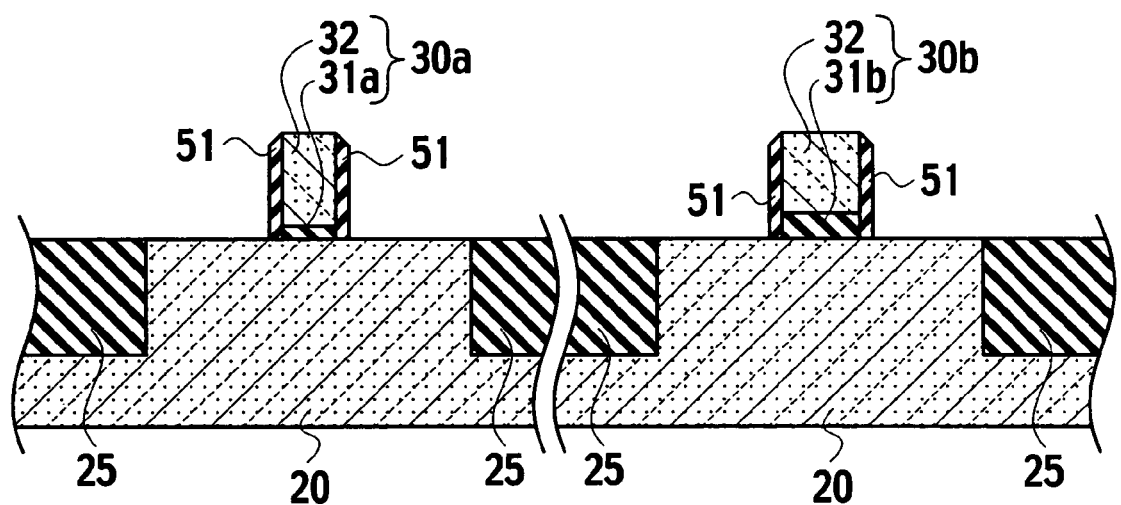

Selective etching is then performed by reactive ion etching (RIE) until exposing the surface of the semiconductor substrate 20. The photoresist 42 is used as an etching mask. As a result, a gate electrode 30a of the high speed transistor Qa and a gate electrode 30b of the low speed transistor Qb are formed. Once the photoresist 42 is removed, an approximately 2 to 10 nm thick silicon nitride film is formed across the entirety of the semiconductor substrate 20. This silicon nitride film is then subjected to anisotropic etching by RIE or the like. As a result, offset spacers 51 are formed on sidewalls of the gate electrode 30a and the gate electrode 30b, as shown in FIGS. 8A and 8B.

A photoresist 43 is then applied across the entirety of the semiconductor substrate 20. The photoresist 43 is exposed and developed, and then removed in the low speed circuit area 12. As shown in FIGS. 9A and 9B, arsenic (As) or phosphorous (P) ions are implanted in the low speed circuit area 12 of the semiconductor substrate 20 using the gate electrode 30b, the offset spacers 51, and the photoresist 43 of the low speed transistor Qb as a mask. As a result, a first source and drain extension regions of the low speed transistor Qb are formed. Field concentration of the implanted As or P ions is in a range of approximately $1 \times 10^{13}$ to $1 \times 10^{14}$ cm$^{-2}$.

Once the photoresist 43 is removed, a silicon oxide film is deposited across the entirety of the semiconductor substrate 20. First gate sidewalls 52 are then deposited on sidewalls of the gate electrode 30a and the gate electrode 30b by subjecting the silicon oxide film to anisotropic etching by RIE or the like. Next, As, P ions or the like are implanted in a self aligning manner using the gate electrode 30a, the gate electrode 30b, and the first gate sidewalls 52 as a mask. Field concentration of the implanted impurity is in a range of approximately 1 to 5 $10^{15}$ cm$^{-2}$. Furthermore, a heat treatment such as rapid thermal annealing (RTA) or the like is carried out at about 1000 degrees Celsius or greater to activate the implanted impurity. As a result, a source region 60a and a drain region 61a are internally formed near the surface of the semiconductor substrate 20 in the high speed circuit area 11, as shown in FIG. 10A. At the same time, a source region 60b and a drain region 61b are internally formed near the surface of the semiconductor substrate 20 in the low speed circuit area 12, as shown in FIG. 10B. At this time, n-type impurity ions are implanted in the gate electrode 30a and the gate electrode 30b, so that an n-type conductivity is provided. Furthermore, a first source extension region 62b and a first drain extension region 63b of the low speed transistor Qb are formed as shown in FIG. 10B. Thickness $d_{ex2}$ of the first source extension region 62b and the first drain extension region 63b is in a range of approximately 30 to 60 nm.

Next, the first gate sidewalls 52 are removed by dilute hydrofluoric acid (DHF) processing or the like. A photoresist 44 is then applied across the entirety of the semiconductor substrate 20. As shown in FIGS. 11A and 11B, the photoresist 44 is exposed and developed, and then removed only in the high speed circuit area 11. As ions are then implanted in the high speed circuit area 11 of the semiconductor substrate 20 using the gate electrode 30a, the offset spacers 51, and the photoresist 44 of the high speed transistor Qa as a mask to form a second source extension region 62a and a second drain extension region 63a. The field concentration of the implanted As ions is in a range of approximately $1 \times 10^{14}$ to $3 \times 10^{15}$ cm$^{-2}$ with an acceleration energy of no more than 5 keV. Once the photoresist 44 is removed, a laser beam is irradiated only on the high speed circuit area 11 by a line scanning heat treatment apparatus, so as to carry out high temperature laser heat treatment, as shown in FIG. 12A. The implanted As ions are activated by the high temperature laser heat treatment, and the second source extension region 62a and the second drain extension region 63a of the high speed transistor Qa are formed. The thickness $d_{ex1}$ of the second source extension region 62a and the second drain extension region 63a is approximately 20 nm, and sheet resistance $R_{S1}$ is in a range of approximately 500 to 1000 ohm/square.

Figures 13A, 13B:
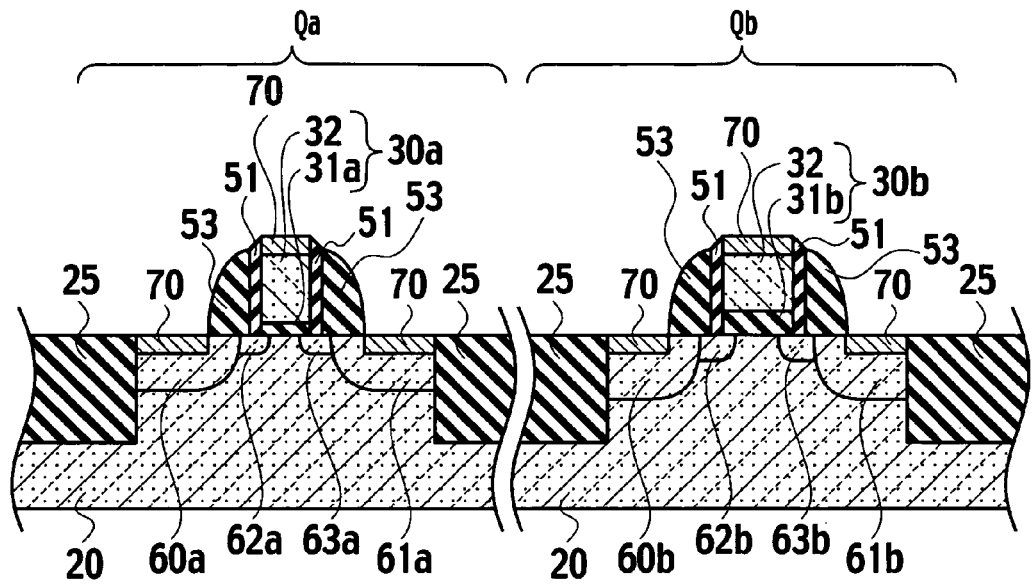

Next, a silicon nitride film is deposited and subjected to anisotropic etching by RIE to form second gate sidewalls 53. Nickel (Ni) is deposited by sputtering and then subjected to heat treatment, thereby forming salicide. By having formed salicide, as shown in FIGS. 13A and 13B, nickel silicide (NiSi) films 70 are formed on the surfaces of the gate electrode 30a, the source region 60a, and the drain region 61a of the high speed transistor Qa, and the gate electrode 30b, the source region 60b, and the drain region 61b of the low speed transistor Qb.

By the processes described thus far, the high speed transistor Qa and the low speed transistor Qb, comprising the semiconductor integrated circuit shown in FIG. 1, are completed. Connections between the elements comprising the semiconductor integrated circuit are established through a multilevel interconnecting process, completing the semiconductor integrated circuit shown in FIG. 1.

With the semiconductor integrated circuit fabrication method described above, only the high speed chip areas 211 through 21n are scanned with a laser beam using a line scanning heat treatment apparatus. As a result, the thickness $d_{ex1}$ of the second source extension region 62a and the second drain extension region 63a of the high speed transistor Qa is thinner than the thickness $d_{ex2}$ of the first source extension region 62b and the first drain extension region 63b of the high speed transistor Qb. On the other hand, in the low speed circuit area 12 to which high temperature laser heat treatment is not applied, the low speed transistor Qb with few defects may be formed. Since the high speed chip areas 211 through 21n and the low speed chip areas 221 through 22n are arranged on the wafer 200 at fixed intervals, a line scanning heat treatment apparatus can easily scan just the high speed chip areas 211 through 21n.

According to the semiconductor integrated circuit fabrication method of the embodiment of the present invention, different heat treatments may be applied to the high speed circuit areas 11 and the low speed circuit areas 12. Therefore, a fabrication method for a semiconductor integrated circuit having a plurality of circuits subjected to different heat treatment conditions and integrated on the same chip may be provided.

FIRST MODIFIED EXAMPLE

With the description of the embodiment already given, an example of forming the first source extension region 62b and the first drain extension region 63b of the low speed transistor Qb, which is formed in the low speed circuit area 12, by a heat treatment such as RTA has been described. However, the first source extension region 62b and the first drain extension region 63b of the low speed transistor Qb may be formed using a line scanning heat treatment apparatus. In other words, high temperature laser heat treatment is carried out by varying the setting of the line scanning heat treatment apparatus in accordance with the switching speed and the amount of leakage current required by the circuits. For example, a low-power laser beam set to have less output power than when carrying out heat treatment for the high speed circuit area 11 can be used to irradiate the low speed circuit area 12 and activate ions implanted in the low speed circuit area 12. Alternatively, the ions implanted in the low speed circuit area 12 may be activated by irradiating a laser beam on the low speed circuit area 12 for a shorter duration than when irradiating the high speed circuit area 11. At this time, the output power of the laser beam is set to a value that does not allow development of leakage current which exceeds an allowable amount in the DRAM 121 arranged in the low speed circuit area 12. In addition, width of areas irradiated by the laser beam is adjusted in accordance with width W2 of the low speed chip area 12.

Furthermore, implantation of As ions for formation of the first source extension region 62b and the first drain extension region 63b of the low speed transistor Qb may be carried out after the source region 60b and the drain region 61b of the low speed transistor Qb are formed. The low speed circuit area 12 is then subjected to heat treatment by a line scanning heat treatment apparatus to form the first source extension region 62b and the first drain extension region 63b. Since the high speed chip areas 211 through 21n and the low speed chip areas 221 through 22n are linearly arranged on the wafer 200 at fixed intervals, a line scanning heat treatment apparatus can easily scan the respective high speed chip areas 211 through 21n and the low speed chip areas 221 through 22n.

SECOND MODIFIED EXAMPLE

Figure 14:
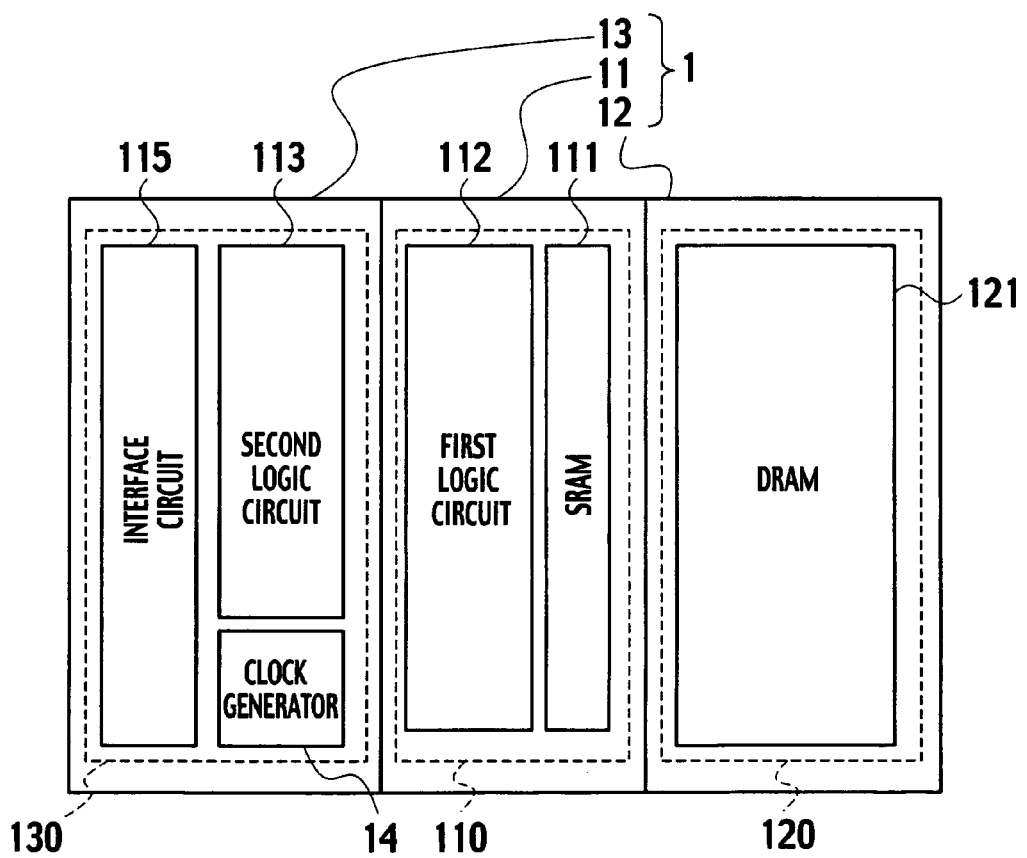
FIG. 14 is a schematic view showing a structure of a semiconductor integrated circuit according to modified examples of the embodiment of the present invention.

A semiconductor integrated circuit according to a second modified example of the embodiment of the present invention, as shown in FIG. 14, comprises a rectangular high speed circuit area 11, a rectangular low speed circuit area 12 adjacent to the high speed circuit area 11, and a rectangular middle speed circuit area 13 adjacent to the high speed circuit area 11. In other words, the semiconductor integrated circuit shown in FIG. 14 differs from FIG. 1 in that the middle speed circuit area 13 is included. A middle speed circuit 130 is comprised of middle speed transistors, each having a third source extension region and a third drain extension region. The third source and drain extension regions are thinner than the first source and drain extension regions and thicker than the second source and drain extension regions, and is arranged in the middle speed circuit area 13.

For example, the high speed circuit 110 for which a fast transistor switching speed is paramount is arranged in the high speed circuit area 11. The low speed circuit 120 for which memory data retention is paramount is arranged in the low speed circuit area 12. The middle speed circuit 130 has a slower transistor switching speed than the high speed circuit 110 and less memory data retention than the low speed circuit 120, and is arranged in the middle speed circuit area 13.

For example, as shown in FIG. 14, SRAM 111 and a first logic circuit 112 are arranged in the high speed circuit area 11. DRAM 121 is arranged in the low speed circuit area 12. A second logic circuit 113, a clock generator 114, and an interface circuit 115 are arranged in the middle speed circuit area 13.

The high speed circuit area 11 and the middle speed circuit area 13 are subjected to heat treatment by a line scanning heat treatment apparatus. However, different operating speeds are desired to be obtained from the middle speed circuit 130 and the high speed circuit 110. Therefore, conditions for the line scanning heat treatment apparatus are different when treating the middle speed circuit area 13 and when treating the high speed circuit area 11. For example, compared to the conditions for subjecting the high speed circuit area 11 to heat treatment, the laser output power of the line scanning heat treatment apparatus is decreased to irradiate the middle speed circuit area 13. By reducing the laser output power, the temperature in the middle speed circuit area 13 that is subjected to the line scanning heat treatment apparatus may be kept lower than the high speed circuit area 11. As a result, leakage current due to crystal defects resulting from high temperature laser heat treatment of the middle speed circuit area 13 may be reduced. At the same time, the middle speed circuit 130 may be operated at a higher speed than the low speed circuit 120.

As described above, according to the semiconductor integrated circuit shown in FIG. 14, circuits subjected to three types of heat treatment conditions may be integrated in the same chip. As a result, three types of circuits differing in circuit operating speed and amount of leakage current may be integrated on the chip 1.

Fabrication of a semiconductor integrated circuit using at least four types of heat treatment conditions can be carried out in the same way. For example, in the case of integrating circuits with four types of heat treatment conditions on the chip 1, four parallel, rectangular chip areas are arranged on the chip 1. Next, the circuits included in the semiconductor integrated circuit are categorized according to heat treatment conditions, and circuits subjected to the same heat treatment conditions are arranged in the same chip area. Conditions for the line scanning heat treatment apparatus are set for each chip area, subjecting respective areas to heat treatment. Alternatively, a chip area not subjected to high temperature laser heat treatment is specified, so that a circuit not requiring high temperature laser heat treatment is arranged in a different chip area.

OTHER EMBODIMENTS

The case of SRAM 111, the first logic circuit 112, the second logic circuit 113, the clock generator 114, the interface circuit 115, and DRAM 121 being integrated on the chip 1 has been given in the above description. The present invention also applies to a semiconductor integrated circuit having circuits with other various functions integrated on the chip 1. For example, a flash memory or the like emphasizing integration density and memory data retention rather than transistor switching speed may be arranged in the low speed circuit area 12.

Various modifications will become possible for those skilled in the art after receiving the teachings of the present disclosure without departing from the scope thereof.

What is claimed is:

1. A semiconductor integrated circuit comprising:
   a rectangular low speed circuit area including a low speed circuit comprising a low speed transistor having a first source extension region and a first drain extension region; and
   a rectangular high speed circuit area adjacent to the low speed circuit area and including a high speed circuit comprising a high speed transistor having a second source extension region and a second drain extension region thinner than the first source and drain extension regions.

2. The semiconductor circuit of claim 1, wherein the high speed transistor has a thinner gate insulating film than the low speed transistor.

3. The semiconductor circuit of claim 1, wherein the low speed circuit area has fewer crystal defects than the high speed circuit area.

4. The semiconductor circuit of claim 1, wherein a dynamic random access memory is arranged in the low speed circuit area.

5. The semiconductor circuit of claim 1, wherein the high speed circuit operates at a higher speed than the low speed circuit.

6. A wafer comprising:
   a plurality of low speed chip areas in which a plurality of low speed circuit areas are arranged in a column direction, each including a low speed circuit comprising a low speed transistor having a first source extension region and a first drain extension region; and
   a plurality of high speed chip areas in which a plurality of high speed circuit areas are arranged in a column direction, each having a high speed circuit comprising a high speed transistor having a second source extension region and a second drain extension region thinner than the first source and drain extension regions;
   wherein the low speed chip areas and the high speed chip areas are alternately arranged in a row direction.

7. The wafer of claim 6, wherein the high speed transistor has a thinner gate insulating film than the low speed transistor.

8. The wafer of claim 6, wherein the low speed circuit area has fewer crystal defects than the high speed circuit area.

9. The wafer of claim 6, wherein a dynamic random access memory is arranged in the low speed circuit area.

10. The wafer of claim 6, wherein the low speed circuit area and the high speed circuit area are rectangular.

* * * * *